(12) United States Patent
Xie et al.

(10) Patent No.: US 10,249,726 B2
(45) Date of Patent: Apr. 2, 2019

(54) METHODS OF FORMING A PROTECTION LAYER ON A SEMICONDUCTOR DEVICE AND THE RESULTING DEVICE

(71) Applicant: GLOBALFOUNDRIES Inc., Grand Cayman (KY)

(72) Inventors: Ruilong Xie, Niskayuna, NY (US); Chanro Park, Clifton Park, NY (US); Xiuyu Cai, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 57 days.

(21) Appl. No.: 15/451,565

(22) Filed: Mar. 7, 2017

(65) Prior Publication Data
US 2017/0179246 A1 Jun. 22, 2017

Related U.S. Application Data

(62) Division of application No. 14/301,864, filed on Jun. 11, 2014, now Pat. No. 9,634,115.

(51) Int. Cl.
| | |
|---|---|
| *H01L 29/08* | (2006.01) |
| *H01L 29/66* | (2006.01) |
| *H01L 29/78* | (2006.01) |
| *H01L 21/311* | (2006.01) |
| *H01L 21/768* | (2006.01) |
| *H01L 23/535* | (2006.01) |
| *H01L 29/423* | (2006.01) |

(52) U.S. Cl.
CPC .... *H01L 29/4232* (2013.01); *H01L 21/31144* (2013.01); *H01L 21/76832* (2013.01); *H01L 21/76834* (2013.01); *H01L 21/76897* (2013.01); *H01L 23/535* (2013.01); *H01L 29/0847* (2013.01); *H01L 29/665* (2013.01); *H01L 29/6653* (2013.01); *H01L 29/66545* (2013.01); *H01L 29/66628* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 2010/0090321 A1 | 4/2010 | Mulfinger et al. | |
| 2013/0181265 A1* | 7/2013 | Grasshoff | H01L 21/76897 257/288 |
| 2014/0103403 A1 | 4/2014 | Kim et al. | |

* cited by examiner

*Primary Examiner* — Robert K Carpenter
(74) *Attorney, Agent, or Firm* — Amerson Law Firm, PLLC

(57) ABSTRACT

One illustrative example of a transistor device disclosed herein includes, among other things, a gate structure, first and second spacers positioned adjacent opposite sides of the gate structure, and a multi-layer gate cap structure positioned above the gate structure and the upper surface of the spacers. The multi-layer gate cap structure includes a first gate cap material layer positioned on an upper surface of the gate structure and on the upper surfaces of the first and second spacers, a first high-k protection layer positioned on an upper surface of the first gate cap material layer and a second gate cap material layer positioned on an upper surface of the high-k protection layer. The first and second gate cap layers comprise different materials than the first high-k protection layer.

17 Claims, 14 Drawing Sheets

METHODS OF FORMING A PROTECTION LAYER ON A SEMICONDUCTOR DEVICE AND THE RESULTING DEVICE

BACKGROUND OF THE INVENTION

1. Field of the Invention

The present disclosure generally relates to the fabrication of integrated circuits, and, more particularly, to various methods of forming a protection layer on a semiconductor, and the resulting semiconductor device.

2. Description of the Related Art

Generally, in complex circuitry including complex logic portions, MOS technology is presently a preferred manufacturing technique in view of device performance and/or power consumption and/or cost efficiency. In integrated circuits fabricated using MOS technology, field effect transistors (FETs), such as planar field effect transistors and/or FinFET transistors, are provided that are typically operated in a switched mode, i.e., these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In general, as a result of the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first lower end of which is connected to a respective contact region of a circuit element, such as a gate electrode and/or the drain and source regions of transistors, and a second end is connected to a respective metal line in the metallization layer by a conductive via. Such vertical contact structures are considered to be "device-level" contacts or simply "contacts" within the industry, as they contact the "device" that is formed in the silicon substrate. The contact structures may comprise contact elements or contact plugs having a generally square-like or round shape that are formed in an interlayer dielectric material, which in turn encloses and passivates the circuit elements. In other applications, the contact structures may be line-type features, e.g., source/drain contact structures.

As device dimensions have decreased, e.g., transistors with gate lengths of 50 nm and less, the contact elements in the contact level have to be provided with critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, at least the sidewall spacers of the gate electrode structures are used as etch masks for selectively removing the silicon dioxide material in order to expose the contact regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the spacer structures, i.e., the portions exposed by the global contact opening, as an etch mask. Thereafter, an appropriate contact material, such as tungsten and the like, may be filled into the contact trenches.

However, the aforementioned process of forming self-aligned contacts results in an undesirable loss of at least portions of the spacer materials that protect the conductive gate electrode, as will be explained with reference to FIGS. 1A-1B. FIG. 1A schematically illustrates a cross-sectional view of an integrated circuit product 10 at an advanced manufacturing stage. As illustrated, the product 10 comprises a plurality of illustrative gate structures 11 that are formed above a substrate 12, such as a silicon substrate. The gate structures 11 are comprised of an illustrative gate insulation layer 13 and an illustrative gate electrode 14. An illustrative gate cap layer 16 and sidewall spacers 18 encapsulate and protect the gate structures 11. The gate cap layer 16 and sidewall spacers 18 are typically made of silicon nitride. Also depicted in FIG. 1A are a plurality of raised source/drain regions 20 and a layer of insulating material 22, e.g., silicon dioxide. FIG. 1B depicts the product 10 after an opening 24 has been formed in the layer of insulating material 22 for a self-aligned contact. Although the contact etch process performed to form the opening 24 is primarily directed at removing the desired portions of the layer of insulating material 22, portions of the protective gate cap layer 16 and the protective sidewall spacers 18 get consumed during the contact etch process, as simplistically depicted in the dashed regions 26. Given that the cap layer 16 and the spacers 18 are attacked in the contact etch process, the thickness of these protective materials must be sufficient such that, even after the contact etch process is completed, there remains sufficient material to protect the gate structures 11. Accordingly, device manufacturers tend to make the cap layers 16 and spacers 18 having an additional thickness that may otherwise not be required but for the consumption of the cap layers 16 and the spacers 18 during the contact etch process. In turn, increasing the thickness of such structures, i.e., increasing the thickness of the gate cap layers 16, causes other problems, such as increasing the aspect ratio of the contact opening 24 due to the increased height, increasing the initial gate height, which makes the gate etching and spacer etching processes more difficult, etc. Additionally, the source/drain regions 120 may also be subjected to undesirable attack during the contact formation process.

The present disclosure is directed to various methods of forming a protection layer on a semiconductor, and the resulting semiconductor device, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative example of a transistor device disclosed herein includes, among other things, a gate structure, first and second spacers positioned adjacent opposite sides of the gate structure, and a multi-layer gate cap structure positioned above the gate structure and the upper surface of the spacers. The multi-layer gate cap structure includes a first gate cap material layer positioned on an upper surface of the gate structure and on the upper surfaces of the first and second spacers, a first high-k protection layer positioned on an upper surface of the first gate cap material layer, and a second gate cap material layer positioned on an upper surface of the high-k protection layer. The first and second gate cap layers comprise different materials than the first high-k protection layer.

Another illustrative example of a transistor device disclosed herein includes, among other things, a gate structure and first and second spacers positioned adjacent opposite sides of the gate structure. The first and second spacers have upper surfaces. First and second source/drain regions are positioned adjacent the first and second spacers, respectively. A first high-k protection layer contacts a portion of a sidewall of the first spacer and an upper surface of the first source/drain region. A multi-layer gate cap structure is positioned above the gate structure and the upper surfaces of the first and second spacers. The multi-layer gate cap structure includes a first gate cap material layer positioned on an upper surface of the gate structure and on the upper surfaces of the first and second spacers, a second high-k protection layer positioned on an upper surface of the first gate cap material layer and a second gate cap material layer positioned on an upper surface of the second high-k protection layer. The first and second gate cap layers comprise different materials than the second high-k protection layer.

BRIEF DESCRIPTION OF THE DRAWINGS

The disclosure may be understood by reference to the following description taken in conjunction with the accompanying drawings, in which like reference numerals identify like elements, and in which.

Figure 1A:
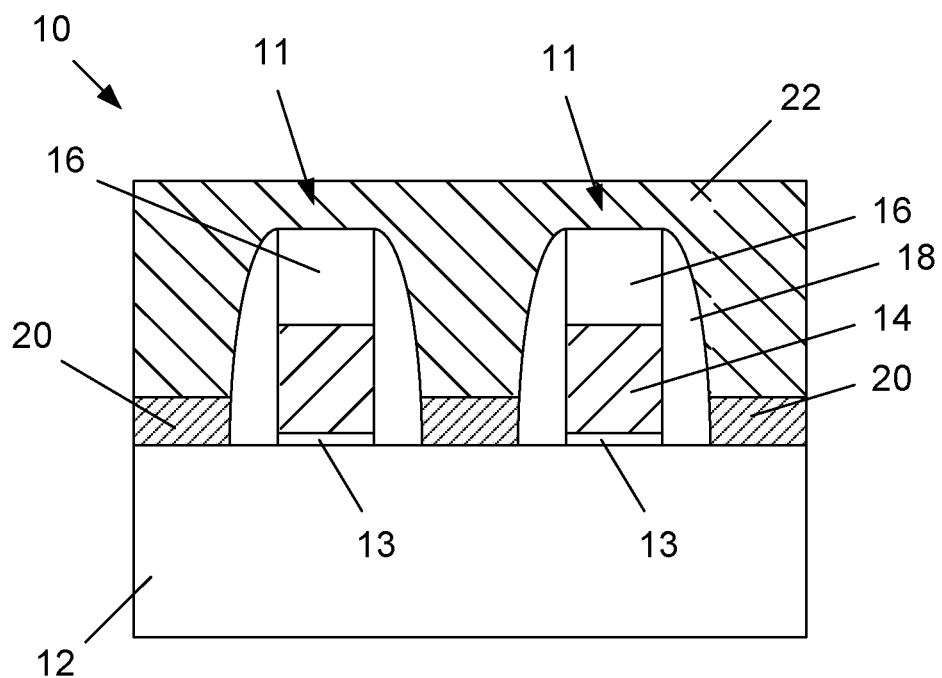
FIGS. 1A-1B schematically illustrate a cross-sectional view of an illustrative prior art integrated circuit product that employs self-aligned contacts.
Figure 1B:
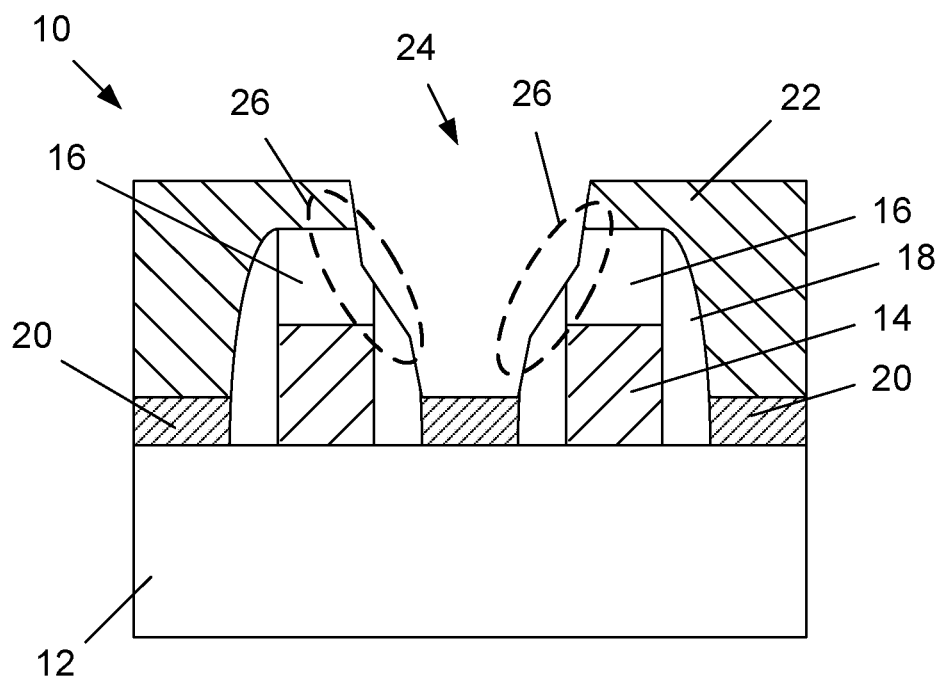

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a protection layer on a semiconductor, and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

Figure 2A:
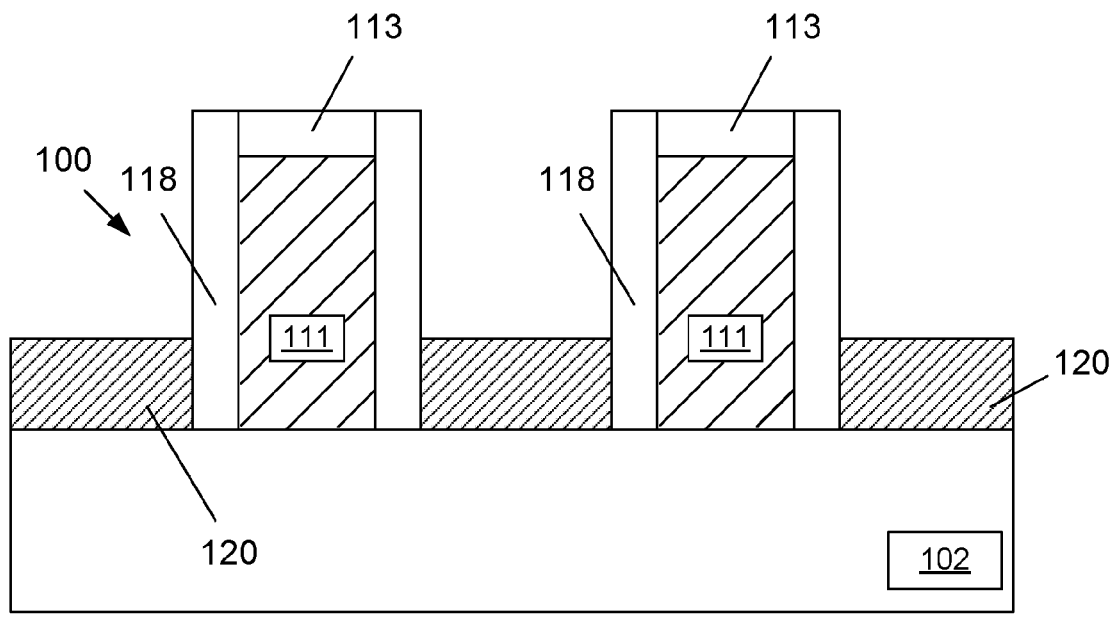
FIGS. 2A-2R depict various illustrative methods disclosed herein of forming a protection layer on a semiconductor, and the resulting semiconductor device.

FIG. 2A schematically illustrates a cross-sectional view of an integrated circuit product 100 at an advanced stage of manufacturing after several process operations were performed. As illustrated, the product 100 comprises a plurality of illustrative, and schematically depicted, sacrificial gate structures 111 that are formed above a substrate 102. Also depicted are a gate cap layer 113, sidewall spacers 118 (simplistically depicted) and raised source/drain regions 120. The substrate 102 may have a variety of configurations, such as the depicted bulk substrate configuration. The substrate 102 may have an SOI (silicon-on-insulator) configuration wherein the semiconductor devices are formed in the active layer of the SOI substrate. The substrate 102 may be made of silicon or it may be made of materials other than silicon. Thus, the terms "substrate," "semiconductor substrate" or "semiconducting substrate" should be understood to cover all semiconducting materials and all forms of such materials. The inventions disclosed herein will be disclosed in the context of forming planar transistor devices using a replacement gate process. However, as will be recognized by those skilled in the art after a complete reading of the present application, the inventions disclosed herein may be applied to the formation of planar FET devices as well as 3D devices, such as FinFET devices. Moreover, the methods disclosed herein are applicable to forming any type of device, e.g., an NFET device, a PFET device, etc. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

With continuing reference to FIG. 2A, the sacrificial gate structures 111 are intended to be representative in nature of any type of sacrificial gate structure that may be employed in manufacturing integrated circuit products using so-called gate-last (replacement gate) manufacturing techniques. In general, the sacrificial gate structures 111 are comprised of a sacrificial gate insulation layer (not separately depicted), such as silicon dioxide, and a sacrificial gate electrode (not separately depicted), such as polysilicon or amorphous silicon. In one illustrative replacement gate manufacturing technique, the layers of material for the sacrificial gate structure including a gate cap layer (not shown) are initially formed/deposited above the substrate 102 and thereafter patterned using traditional masking and etching techniques to thereby define the sacrificial gate structure 111 with the gate cap layer 113 positioned above the sacrificial gate structure 111. Thereafter, the sidewall spacers 118 are formed adjacent the patterned dummy gate structure/cap layer. The sacrificial gate structure 111 remains in place (protected by the spacers and the gate cap layer) as many process operations are performed to form the devices, e.g., the formation of the depicted raised, doped source/drain regions 120, performing an anneal process to repair damage to the substrate 102 caused by the ion implantation processes and to activate the implanted dopant materials. The sidewall spacers 118 and the gate cap layer 113 may be made of materials such as silicon nitride.

Figure 2B:
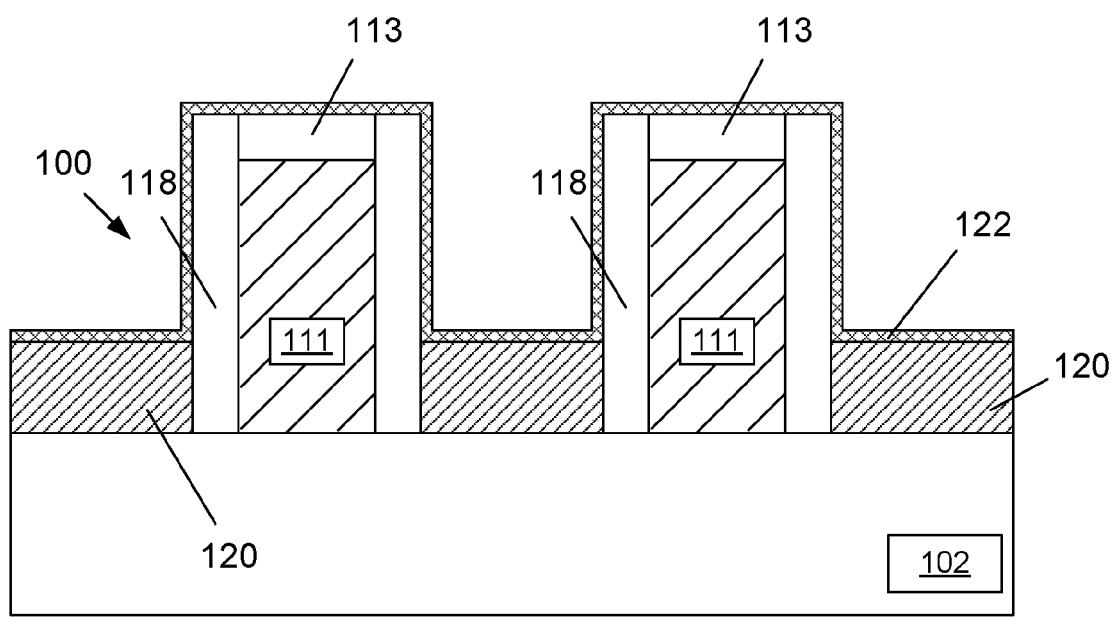

FIG. 2B depicts the product 100 after a first high-k protection layer 122 was conformably deposited on the product 100 by performing, for example, a conformal ALD or CVD process. In one illustrative embodiment, the first high-k protection layer 122 may be comprised of a material having a dielectric constant (k) greater than 7, e.g., hafnium oxide, aluminum oxide, SiCN, etc. The thickness of the first high-k protection layer 122 may vary depending upon the particular application, e.g., 2-6 nm.

Figure 2C:
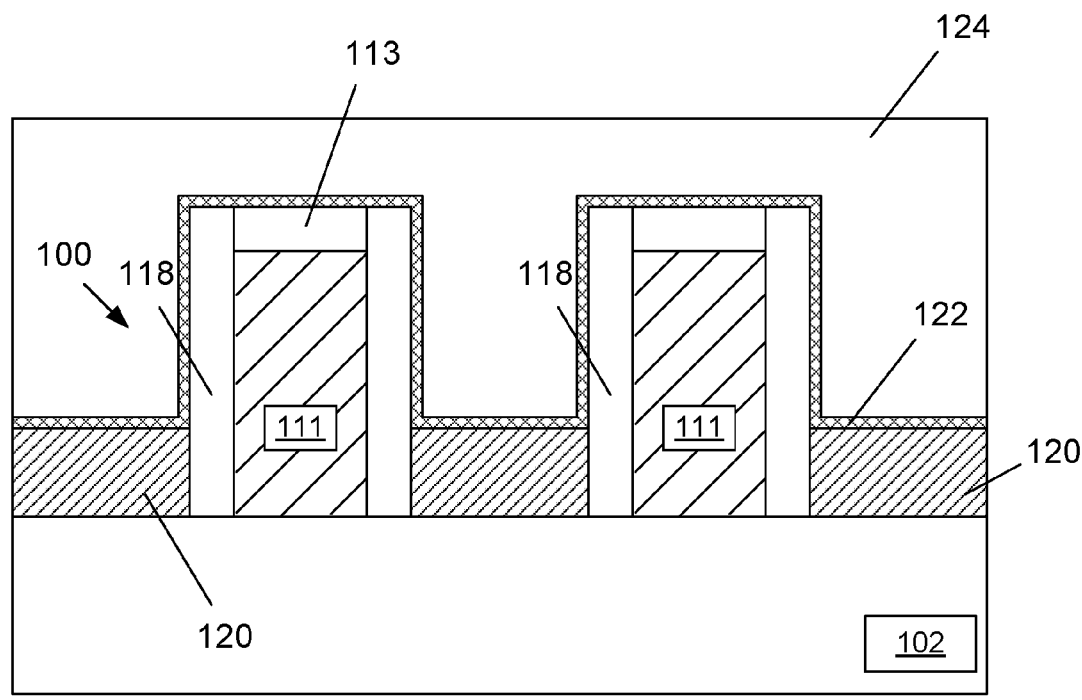

FIG. 2C depicts the device 100 after a sacrificial material layer 124 was formed on the device 100. In one embodiment, the sacrificial material layer 124 is formed such that its upper surface is positioned above the cap layers 113. In one illustrative embodiment, the sacrificial material layer 124 may be comprised of OPL (Optical Planarization Layer), DUO™ oxide, etc. and it may be formed using traditional techniques for forming such materials, e.g., spin-coating, deposition, etc.

Figure 2D:
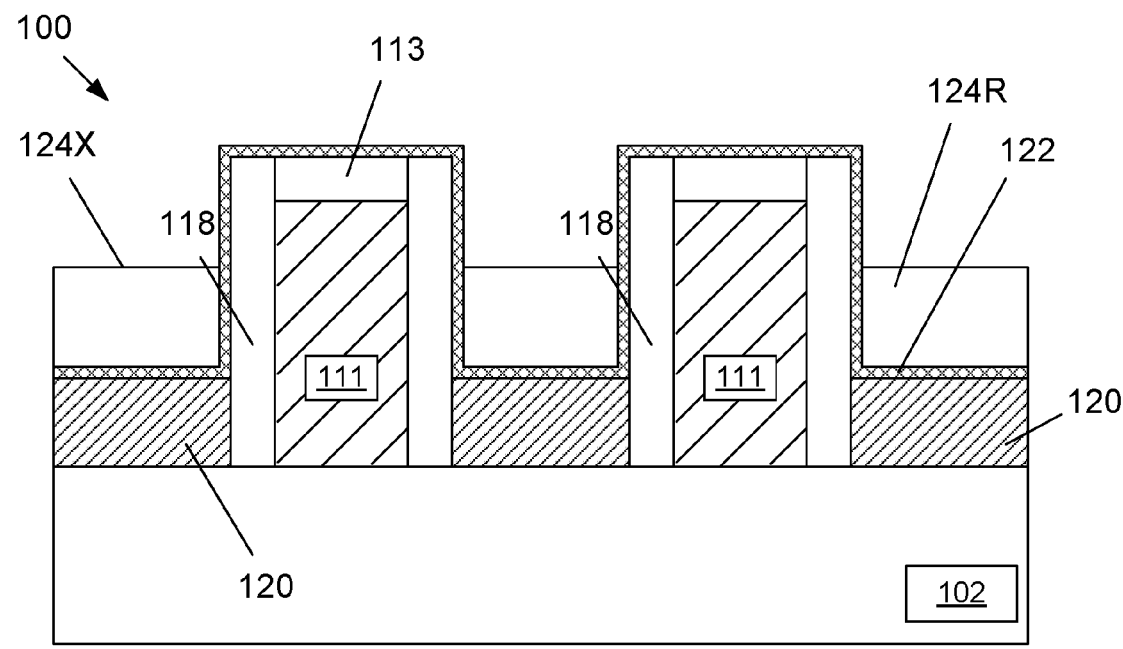

FIG. 2D depicts the device 100 after a recess etching process was performed on the sacrificial material layer 124 to define a recessed sacrificial material layer 124R with a recessed upper surface 124X. After such recessing, the recessed sacrificial material layer 124R exposes portions, but not all, of the first high-k protection layer 122, i.e., the portion above the gate cap layer 113 and some of the layer 122 positioned adjacent the spacers 118. The amount of the recessing depends upon the particular application.

Figure 2E:
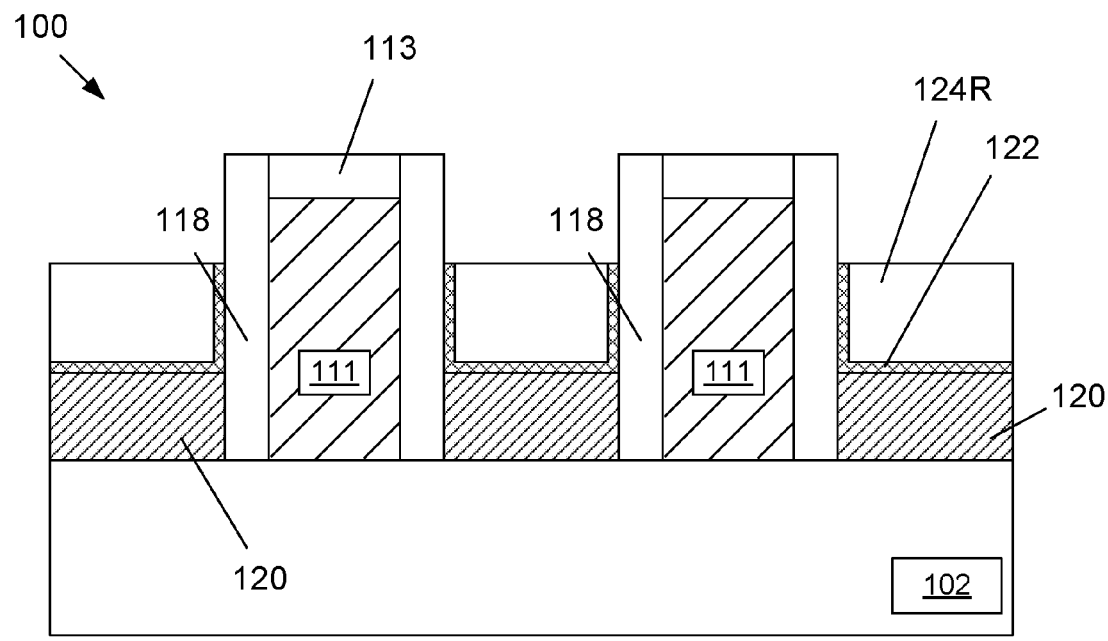

FIG. 2E depicts the product 100 after an etching process was performed to remove the exposed portions of the first high-k protection layer 122 selectively relative to surrounding materials.

Figure 2F:
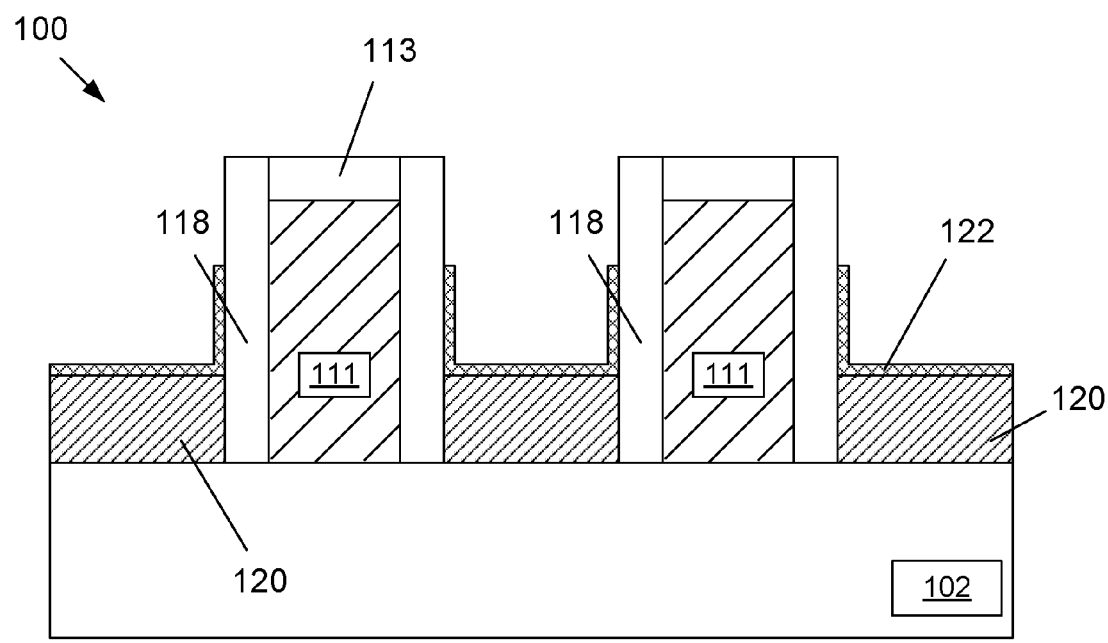

FIG. 2F depicts the product 100 after an etching process was performed to remove the recessed sacrificial material layer 124R selectively relative to surrounding materials.

Figure 2G:
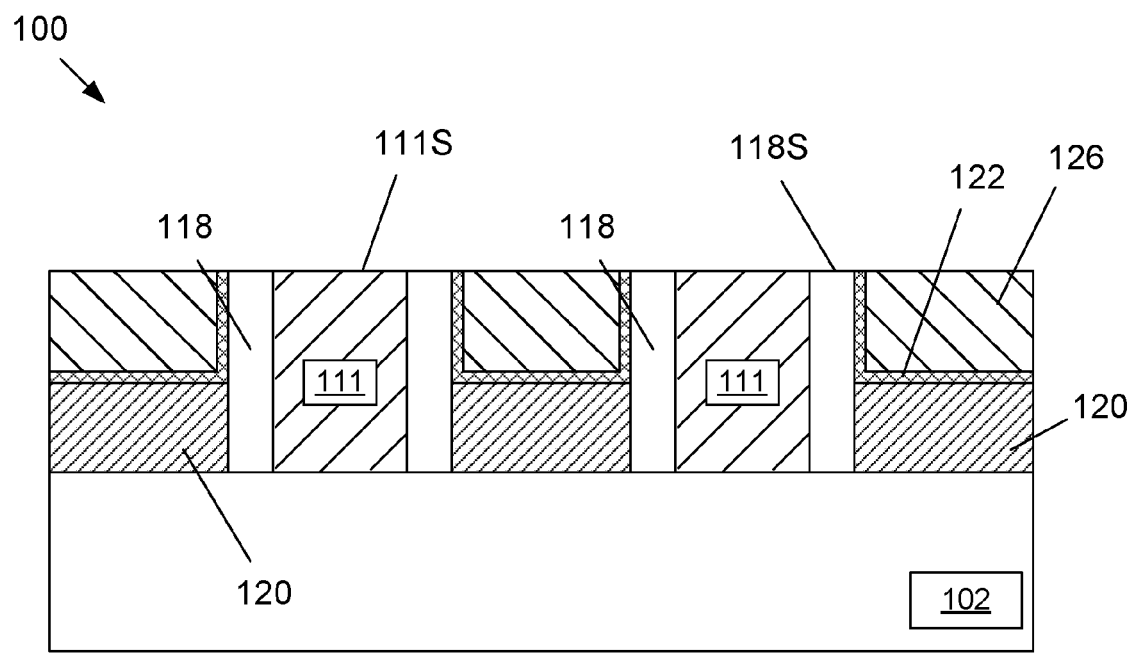

FIG. 2G depicts the device 100 after several process operations were performed. First, a layer of insulating material 126 was deposited so as to over-fill the spaces between the spacers 118. Thereafter, one or more chemical mechanical polishing (CMP) processes were performed to remove the gate cap layers 113 so as to expose the upper surface 111S, i.e., the dummy gate electrode (polysilicon), of the sacrificial gate structure 111.

Figure 2H:
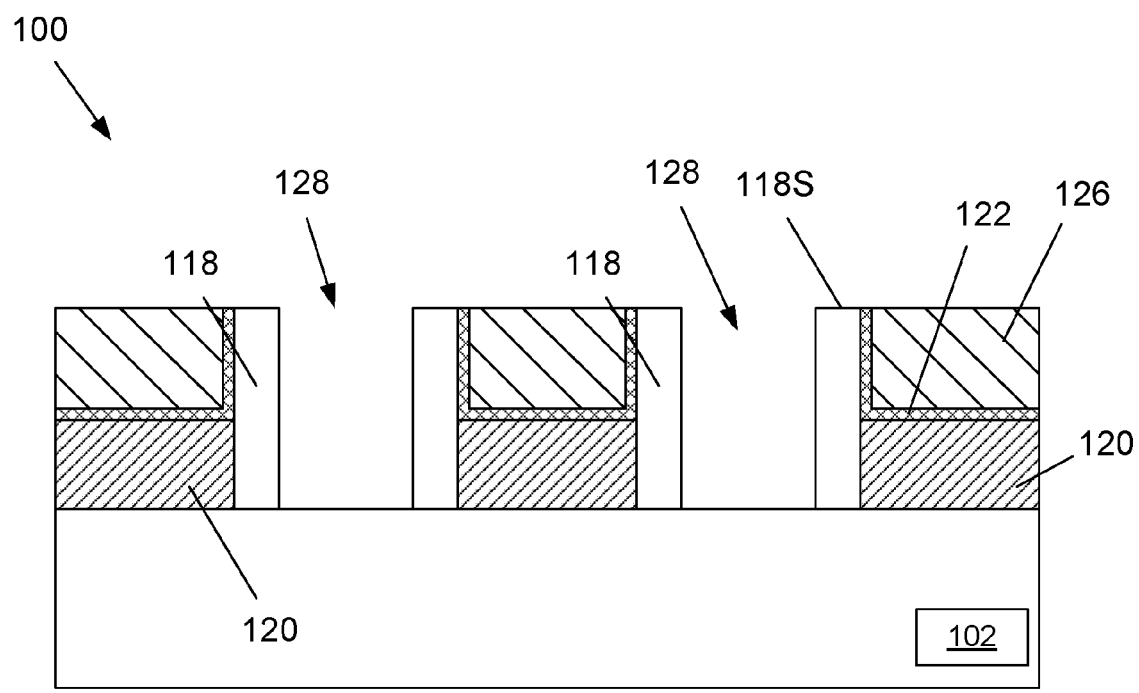

FIG. 2H depicts the product 100 after one or more etching processes were performed to remove the sacrificial gate structure 111 which results in the formation of a replacement gate cavity 128 that is laterally defined by the spacers 118 where the final replacement gate structure for the devices will be formed.

Figure 2I:
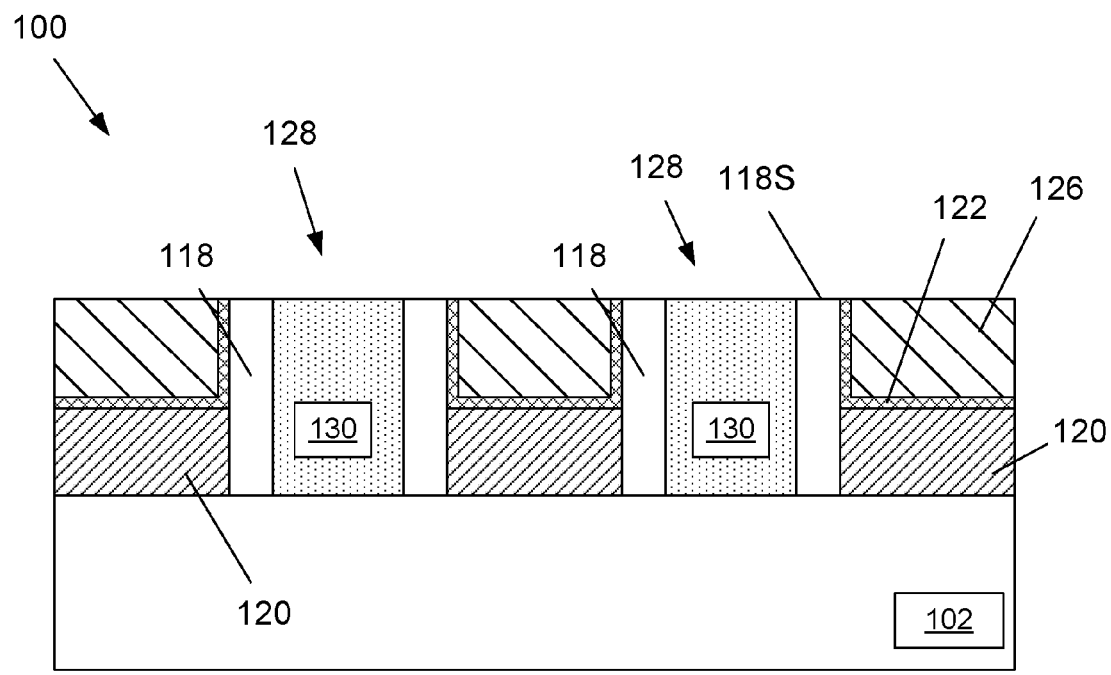

FIG. 2I depicts the device 100 after illustrative and schematically depicted replacement (final) gate structures 130 were formed in the gate cavities 128. The gate structures 130 depicted herein are intended to be representative in nature of any type of replacement gate structure that may be employed in manufacturing integrated circuit products. Typically, a pre-clean process will be performed in an attempt to remove all foreign materials from within the gate cavities 128 prior to forming the various layers of material that will become part of the gate structures 130. Thereafter, the gate structures 130 may be formed by sequentially depositing the materials of the gate structures into the gate cavities 128 and above the layer of insulating material 126 and then performing a CMP process to remove excess materials above the layer of insulating material 126.

Figure 2J:
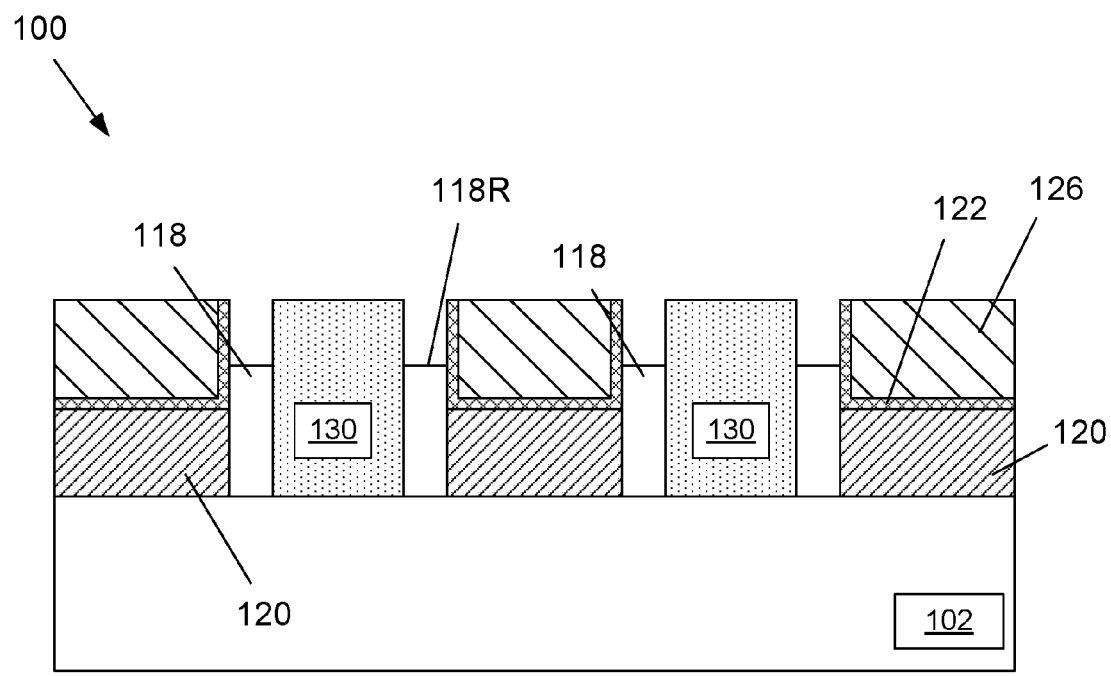

FIG. 2J depicts the device 100 after a recess etching process was performed on the spacers 118 such that the spacers 118 have a recessed upper surface 118R. The amount or extent of recessing of the spacers 118 may vary depending upon the particular application, e.g., 30-50 nm.

Figure 2K:
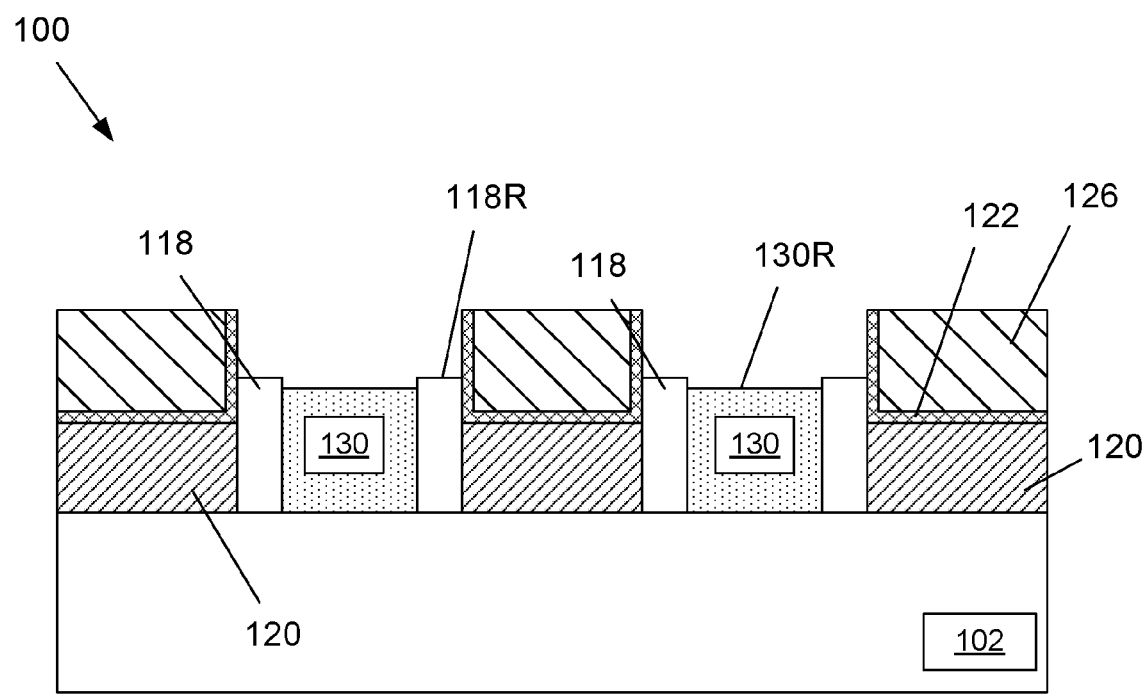

FIG. 2K depicts the device 100 after a recess etching process was performed on the gate structures 130 such that the gate structures 130 have a recessed upper surface 130R that is positioned below the recessed upper surface 118R of the spacers 118. The amount or extent of recessing of the gate structures 130 may vary depending upon the particular application. However, the recessing of the gate structures 130 need not be performed in all applications. That is, in some applications, the upper surface of the gate structures 130 may be at about the same level or slightly above the recessed surfaces 118R of the spacers 118.

Figure 2L:
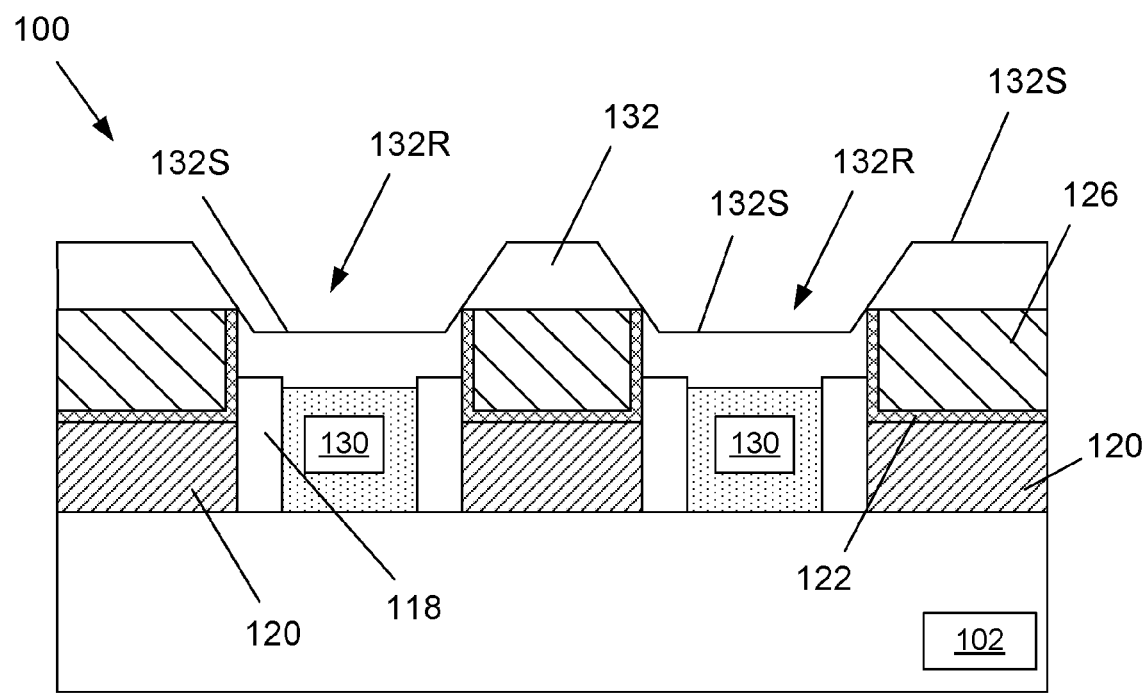

FIG. 2L depicts the device 100 after a high density plasma CVD and etching process operation (hereinafter "HDP CVD-etching process") was performed to form a first gate cap material layer 132. In general, the HDP CVD-etching process is a combination of deposition/etch cycles that result in the first gate cap material layer 132 having an as-deposited, non-planar upper surface 132S. The HDP CVD-etching process typically involves performing a series of CVD deposition and etching processes in a common process chamber without breaking vacuum or transferring the wafer to another chamber, e.g., deposition-etch-deposition-etch, etc. The number and duration of the deposition-etch sequences performed in the HDP CVD-etching process may vary depending upon the particular application and they may vary depending upon factors such as the depth and CD of the opening into which the material is to be deposited. The precise parameters of the HDP CVD-etching process for any particular application may need to be determined based upon experimentation and testing techniques that are within the skill level of those skilled in the art. In one embodiment, the HDP CVD-etching process involves use of $SiH_4$, $N_2/NH_3$ and Ar, where the argon has a sputtering type effect at the same time CVD film deposition is occurring. In one embodiment, during the etching portion of the HDP CVD-etching process, $NF_3$ is used as an etchant gas. However, using the HDP CVD-etching process described herein, the top corner region of an opening, i.e., the region where overhang normally occurs during a standard CVD process, was etched more than the regions inside the opening. The combination of the $NF_3$ etching and the argon sputtering, along with the deposition sequencing, resulted in the first gate cap material layer 132 having the as-deposited, non-planar upper surface 132S. In one embodiment, the first gate cap material layer 132 may be made of an HDP silicon nitride, SiCN, SiBN, etc. The thickness of the first gate cap material layer 132 may vary depending upon the particular application.

Figure 2M:
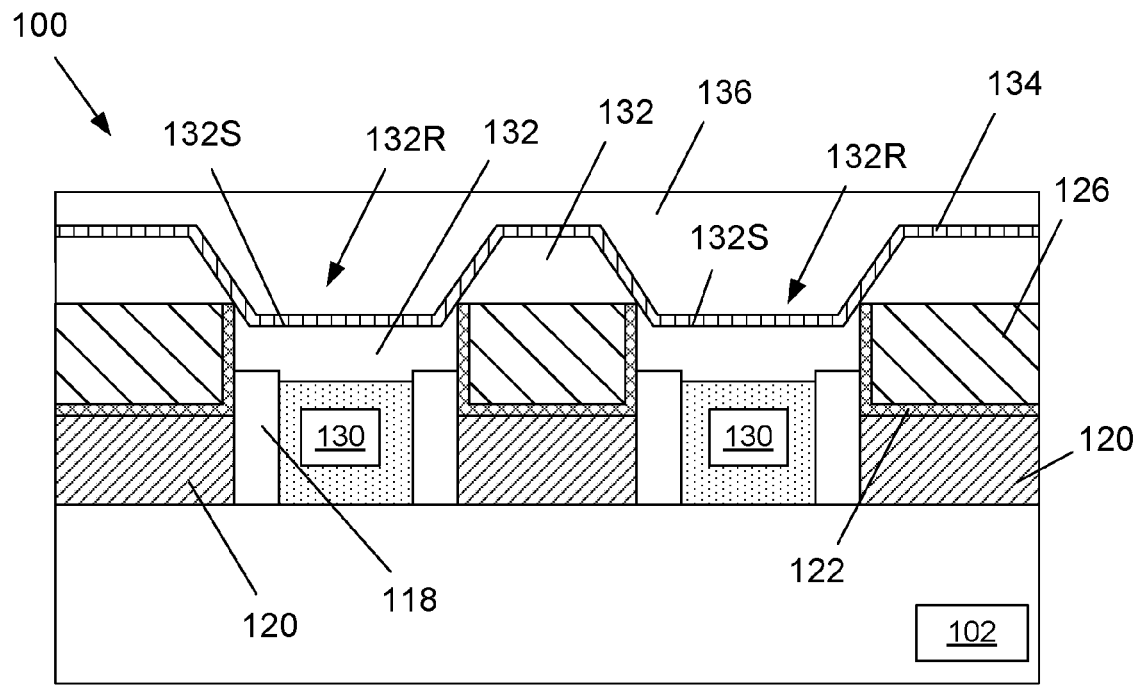

FIG. 2M depicts the device 100 after several process operations were performed. First, a second high-k protection layer 134 was conformably deposited on the product 100 by performing, for example, a conformal ALD or CVD process. Due to the non-planar upper surface 132S of the first gate cap material layer 132, the second high-k protection layer 134 also has a non-planar upper surface. After the formation of the second high-k protection layer 134, portions of the recess 132R remain unfilled above the second high-k protection layer 134. Thereafter, a second gate cap material layer 136 was deposited on the non-planar upper surface of the second high-k protection layer 134 so as to overfill the remaining portion of the recesses 132R. In one illustrative embodiment, the second high-k protection layer 134 may be comprised of a material having a dielectric constant (k) greater than 7, e.g., hafnium oxide, aluminum oxide, SiCN, etc. The thickness of the second high-k protection layer 134 may vary depending upon the particular application, e.g., 2-6 nm. In one embodiment, the second high-k protection layer 134 may be made of the same material as that of the first high-k protection layer 122. The second gate cap material layer 136 may be comprised of the same materials as those of the first gate cap material layer 132.

Figure 2N:
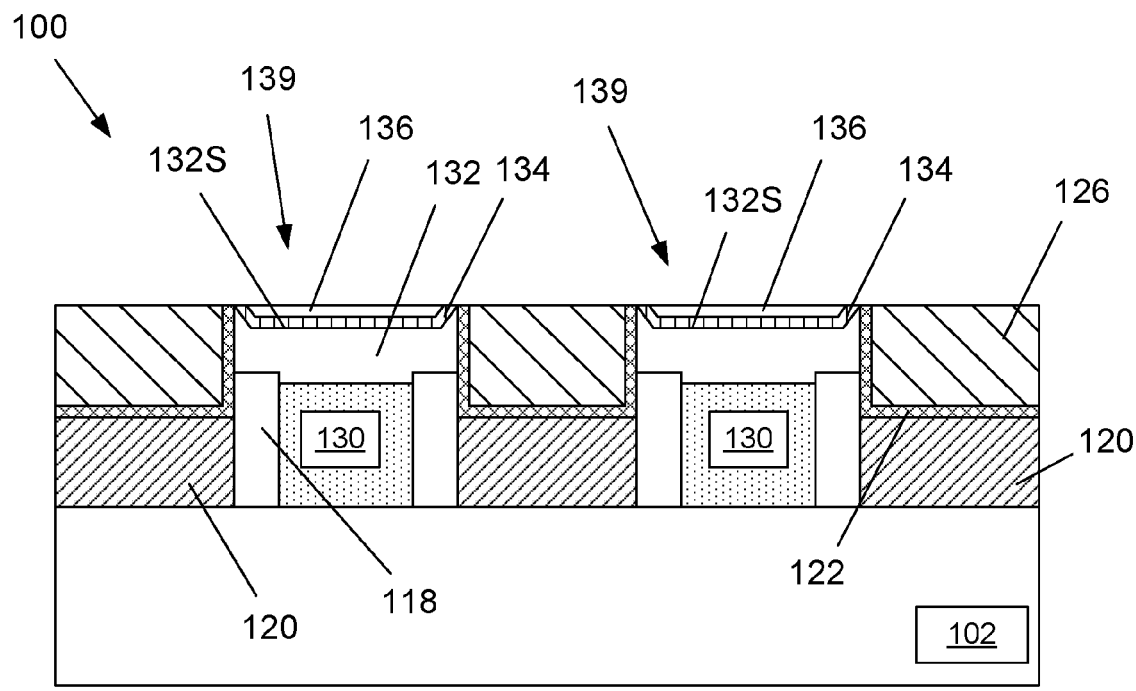

FIG. 2N depicts the device 100 after one or more CMP processes were performed using the layer of insulating material 126 as a polish-stop layer. This operation removes portions of the first and second gate cap material layers 132, 136 and portions of the second high-k protection layer 132 in areas laterally outside the spacers 118, i.e., the materials are removed from above the source/drain regions 120. Importantly, as depicted, the combination of the first and second high-k protection layers 122, 134 substantially encapsulate or cover the gate structures 130, the sidewall spacers 118 and the epi source/drain regions 120, thereby providing a very high degree of protection, if not absolute protection, to these structures of the transistor devices during subsequent contact formation processes (to be discussed more fully below). Additionally, as a result of the processing described above, a multi-layer gate cap structure 139 is provided above each of the gate structures 130. In the depicted example, the multi-layer gate cap structure 139 is comprised of the first gate cap material layer 132, the second gate cap protection layer 134 and the second gate cap material layer 136.

Figure 2O:
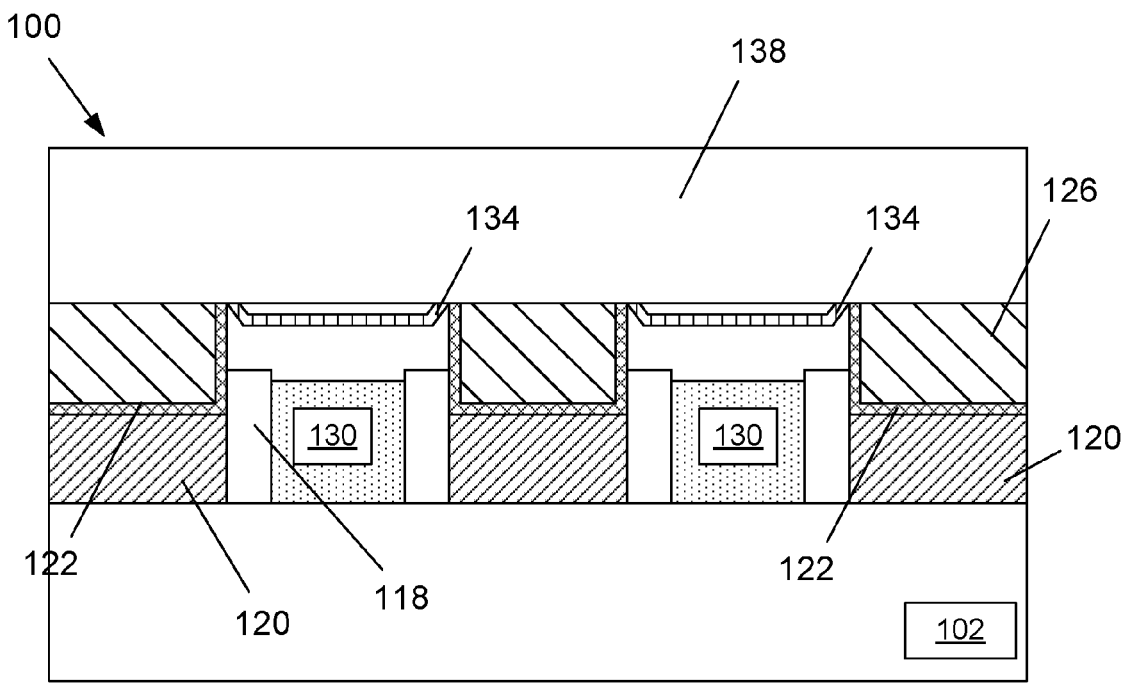

FIG. 2O depicts the product 100 after a layer of insulating material 138 was deposited across the product 100. The layer of insulating material 138 may be comprised of a variety of different materials, such as silicon dioxide, etc., and it may be formed by performing a variety of techniques, e.g., CVD, etc. The thickness of the layer of insulating material 138 may vary depending upon the particular application. The layer of insulating material 138 may be comprised of the same or different materials as that of the layer of insulating material 126.

Figure 2P:
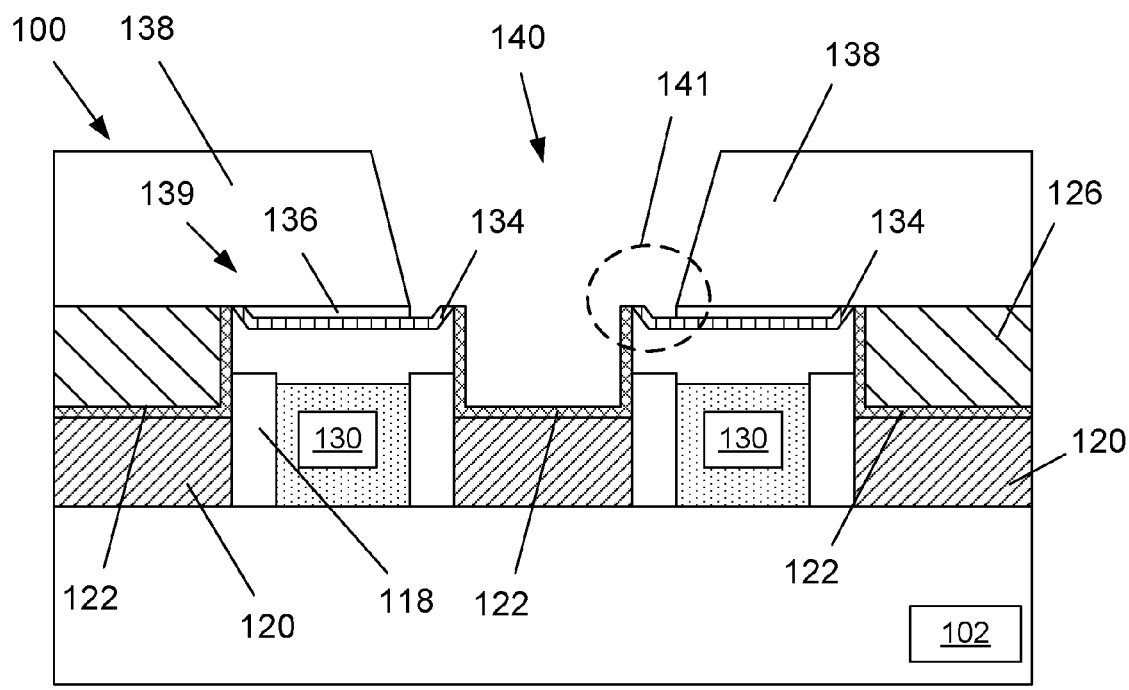

FIG. 2P depicts the product 100 after one or more etching processes were performed on the product 100 through a patterned etch mask (not shown), such as a patterned layer of photoresist material, to thereby define a self-aligned contact opening 140. Such contact openings 140 would be formed above all of the source/drain regions 120 on the product 100, but the drawings only depict the formation of the contact opening 140 between the two gate structures 130 so as not to overly complicate the drawings. The formation of the contact opening 140 removes substantially all of the exposed portions of the layer of insulating material 126 positioned above the source/drain region 120. Importantly, the combination of the first and second high-k protection layers 122, 134 serves as a very etch resistant etch stop layer during the process of forming the contact opening 140, thereby offering substantially complete protection to the gate structures 130, the spacers 118 and the source/drain regions 120 during the contact opening etching processes. Also note that, as depicted in the dashed-line region 141, even if some of the multi-layer gate cap structure 139 is removed during the contact etch process, such as a portion of the second gate cap material layer 136, the underlying second high-k protection layer 134 still provides protection to the underlying gate structure 130.

Figure 2Q:
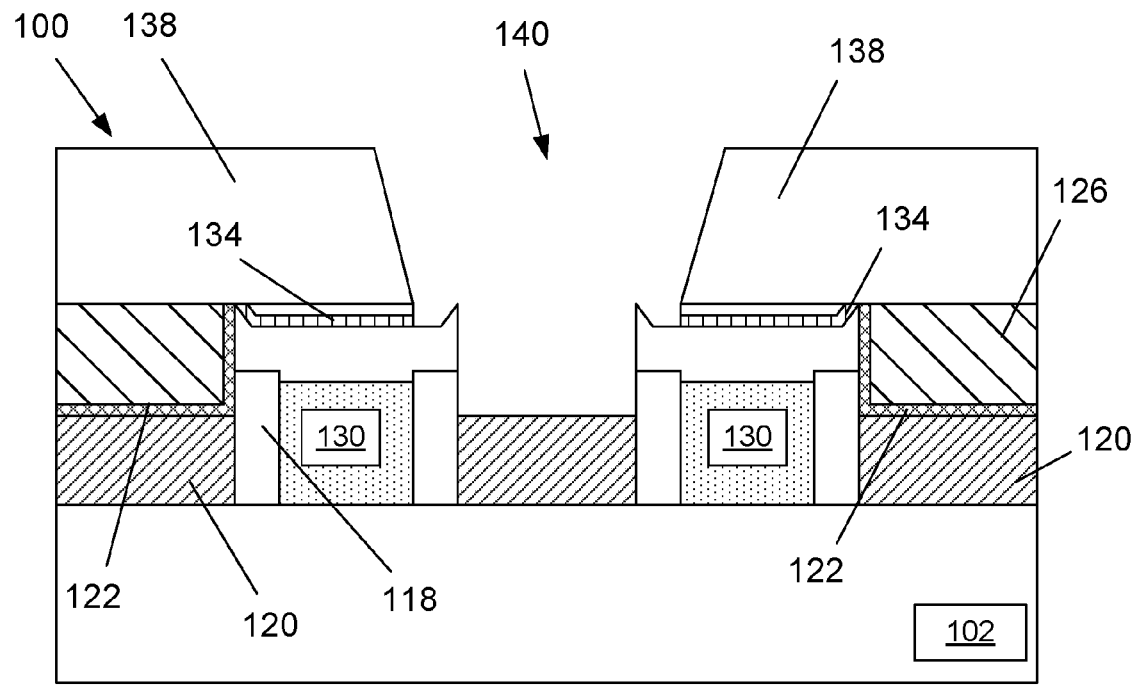

FIG. 2Q depicts the product 100 after one or more etching processes were performed to remove the exposed portions of the first high-k protection layer 122 and the second high-k protection layer 134 selectively relative to surrounding materials. At this point in the process flow, metal silicide regions (not shown) may be formed on the source/drain regions 120. The metal silicide regions may be formed by performing traditional silicide formation techniques.

Figure 2R:
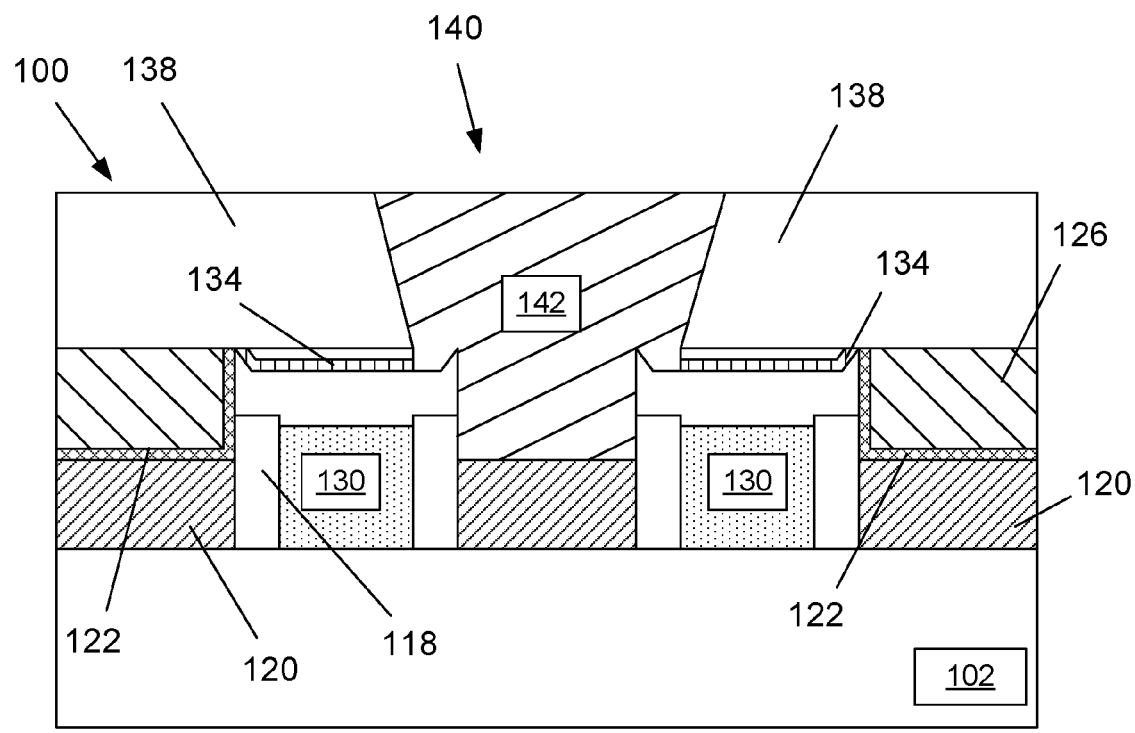

FIG. 2R depicts the product 100 after a conductive, self-aligned contact structure 142 was formed in the self-aligned contact opening 140 such that it is conductively coupled to the source/drain region 120. The self-aligned contact structure 142 is intended to be schematic and representative in nature, as it may be formed using any of a variety of different conductive materials and by performing traditional manufacturing operations. The self-aligned contact structure 142 may also contain one or more barrier layers (not depicted). In one illustrative example, the self-aligned contact structure 142 may be formed by depositing a liner, e.g., a titanium nitride liner, followed by overfilling the self-aligned contact opening 140 with a conductive material, such as tungsten. Thereafter, a CMP process may be performed to planarize the upper surface of the layer of insulating material 138 which results in the removal of excess portions of the liner and the tungsten positioned above the layer of insulating material 138 outside of the self-aligned contact opening 140 and the formation of the self-aligned contact structure 142.

FIGS. 3A-3H depict an embodiment wherein only the multi-layer gate cap structure 139 is formed for the product 100, i.e., the first high-k protection layer 122 is omitted in this illustrative process flow. While not offering the complete protection as provided for by the combination of the first and second high-k protection layers 122, 134, the formation of just the novel multi-layer gate cap structure 139 provides significant protection in the important upper corner of the gate area, an area subjected to attack during normal contact formation process operations.

Figure 3A:
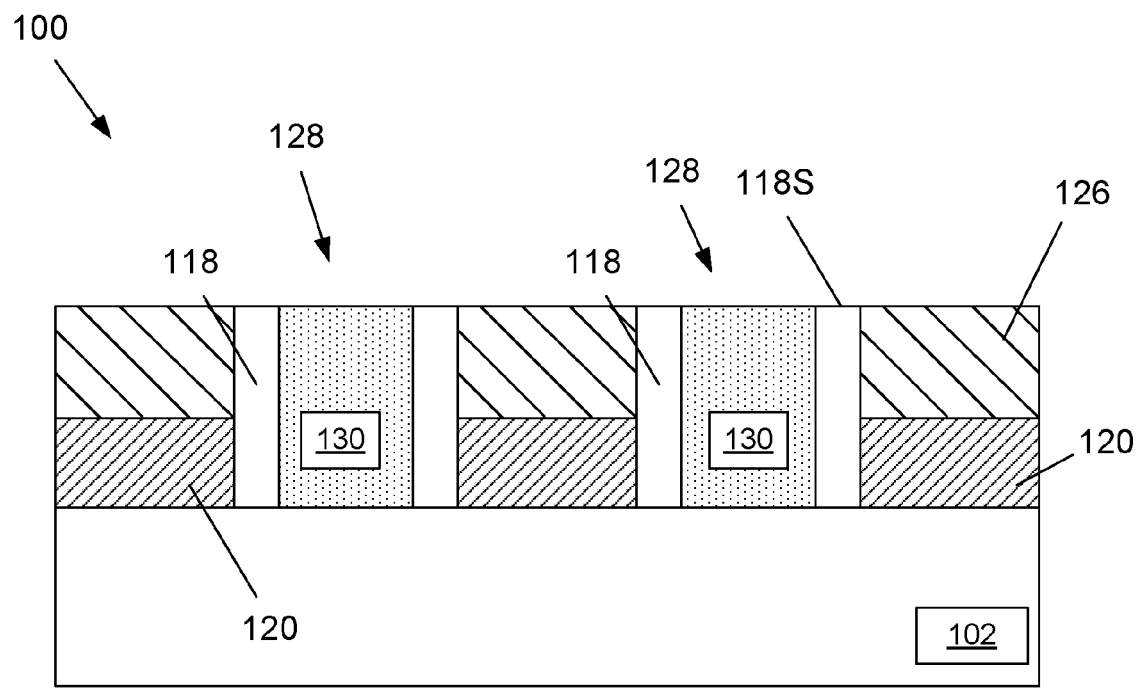
FIGS. 3A-3H depict various novel methods disclosed herein for forming a multi-layer gate cap structure on a semiconductor device, and the resulting device.

FIG. 3A depicts the device 100 at a point in fabrication that corresponds to that shown in FIG. 2I except the formation and removal of parts of the first high-k protection layer 122 have been omitted. That is, FIG. 3A depicts the device 100 after the above-described replacement gate structures 130 were formed in the gate cavities 128.

Figure 3B:
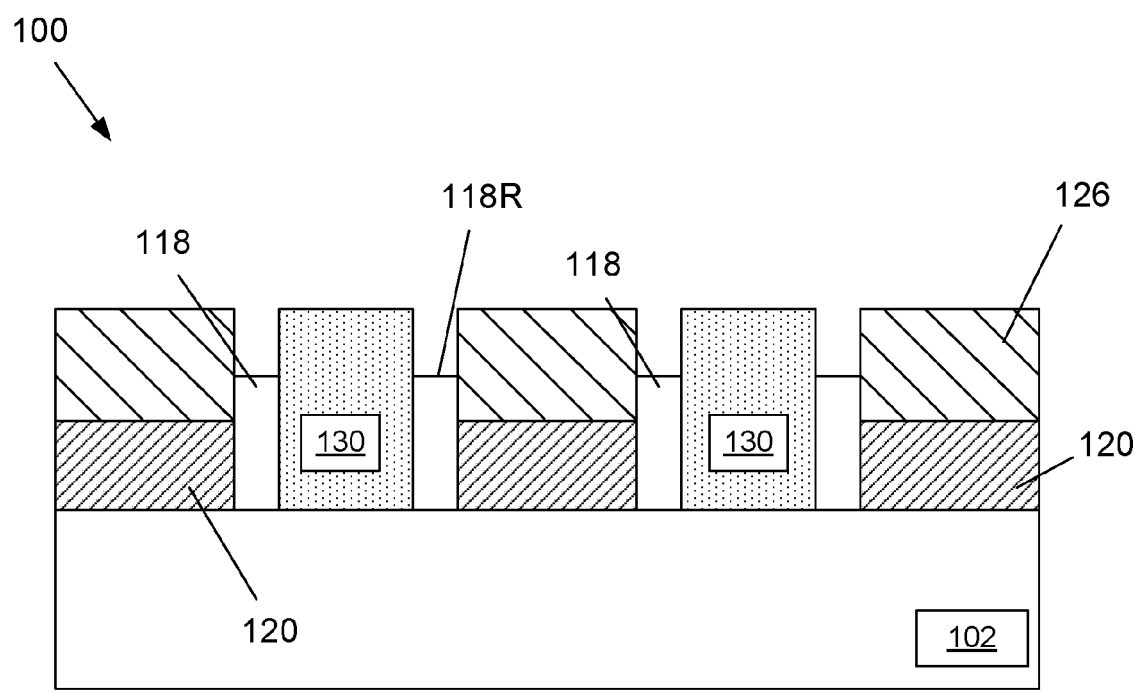

FIG. 3B depicts the device 100 after the above-described recess etching process was performed on the spacers 118 such that the spacers 118 have a recessed upper surface 118R.

Figure 3C:
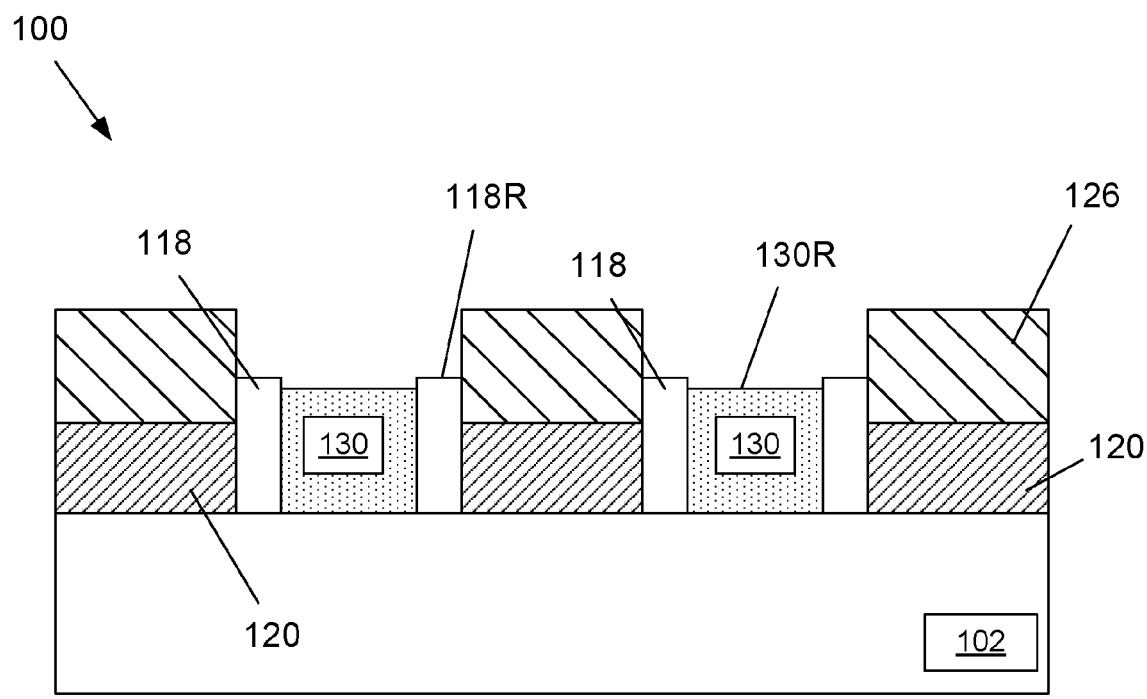

FIG. 3C depicts the device 100 after the above-described recess etching process was performed on the gate structures 130 such that the gate structures 130 have a recessed upper surface 130R that is positioned below the recessed upper surface 118R of the spacers 118.

Figure 3D:
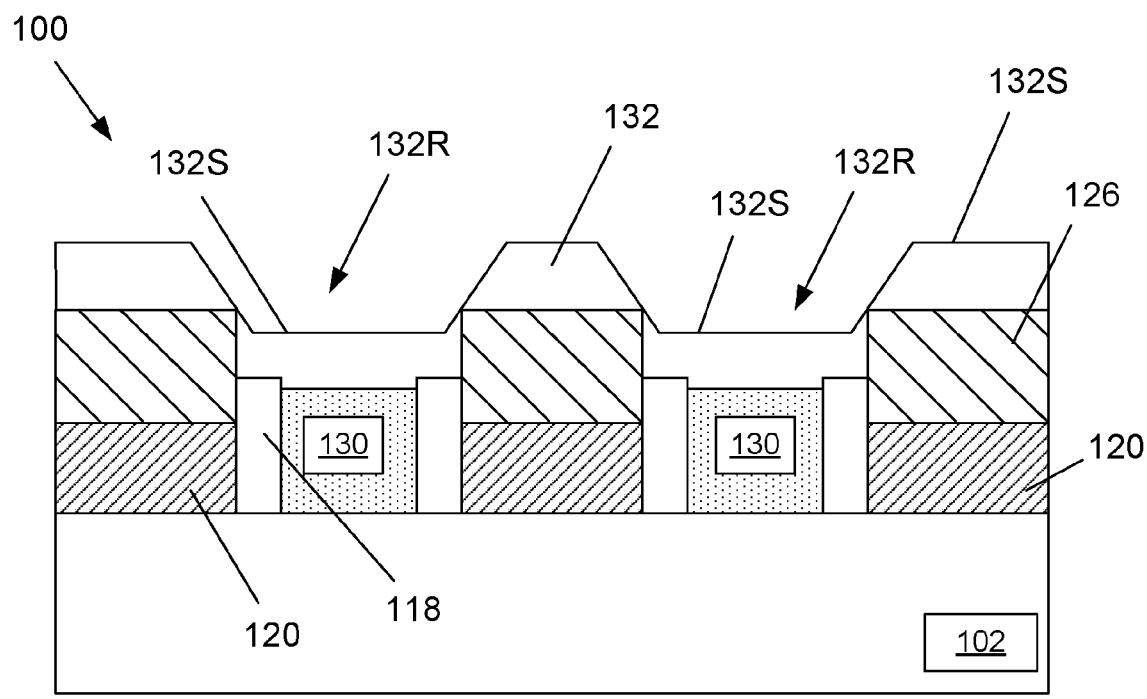

FIG. 3D depicts the device 100 after the above-described HDP CVD-etching process was performed to form the above-described first gate cap material layer 132. As before, the HDP CVD-etching process is controlled such that the gate cap material layer 132 has an as-deposited, non-planar upper surface 132S that defines a recess 132R positioned above the gate structures 130.

Figure 3E:
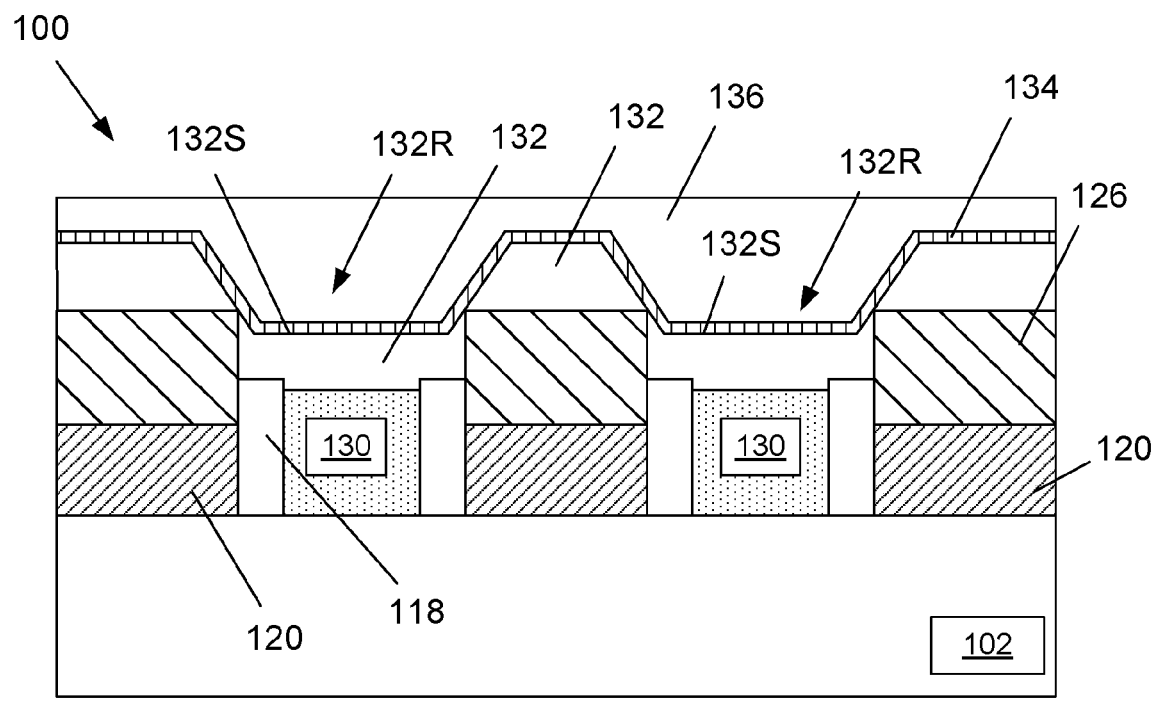

FIG. 3E depicts the device 100 after the above-described second high-k protection layer 134 was conformably deposited on the non-planar upper surface 132S of the first gate cap material layer 132 and after the above-described gate cap material layer 136 was deposited on the second high-k protection layer 134 so as to overfill the recesses 132R. Of course, in this embodiment, the "second" high-k protection layer 134 is the only protection layer formed, but it is still referred to as the second high-k protection layer to avoid confusion.

Figure 3F:
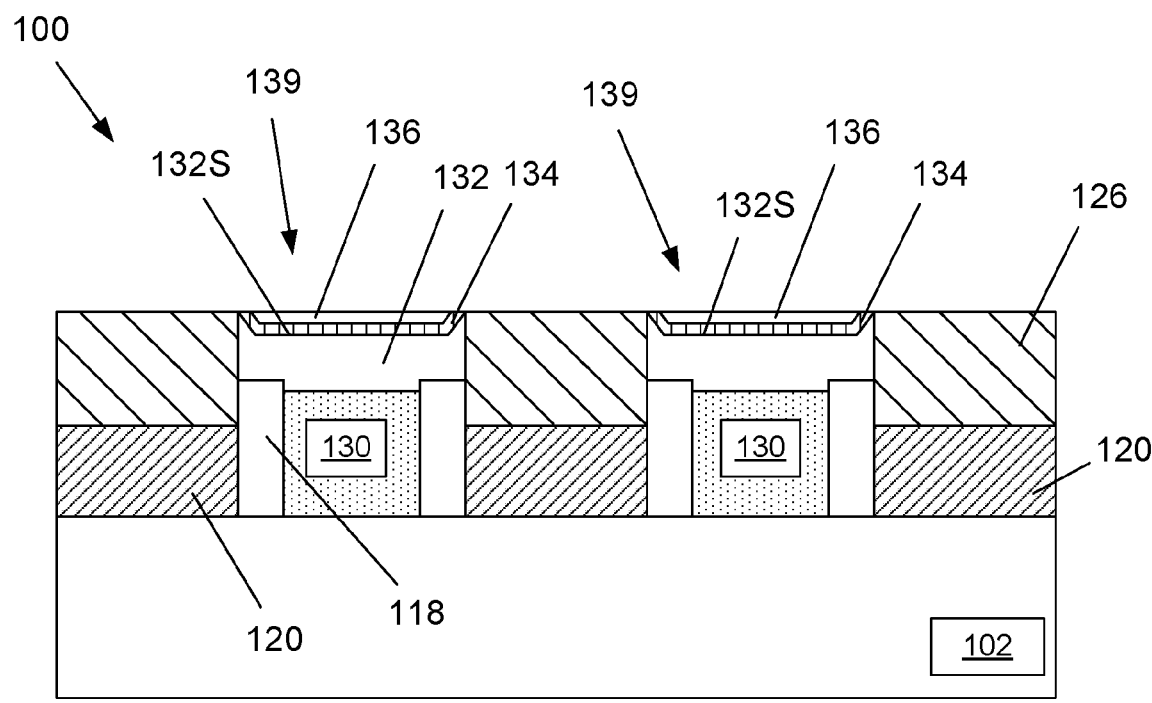

FIG. 3F depicts the device 100 after one or more CMP processes were performed using the layer of insulating material 126 as a polish-stop layer. This operation removes portions of the first and second gate cap material layers 132, 136 and portions of the second high-k protection layer 134. As noted above, as a result of the processing described above, a multi-layer gate cap structure 139 is provided above each of the gate structures 130. In the depicted example, the multi-layer gate cap structure 139 is comprised of the first gate cap material layer 132, the second gate cap protection layer 134 and the second gate cap material layer 136.

Figure 3G:
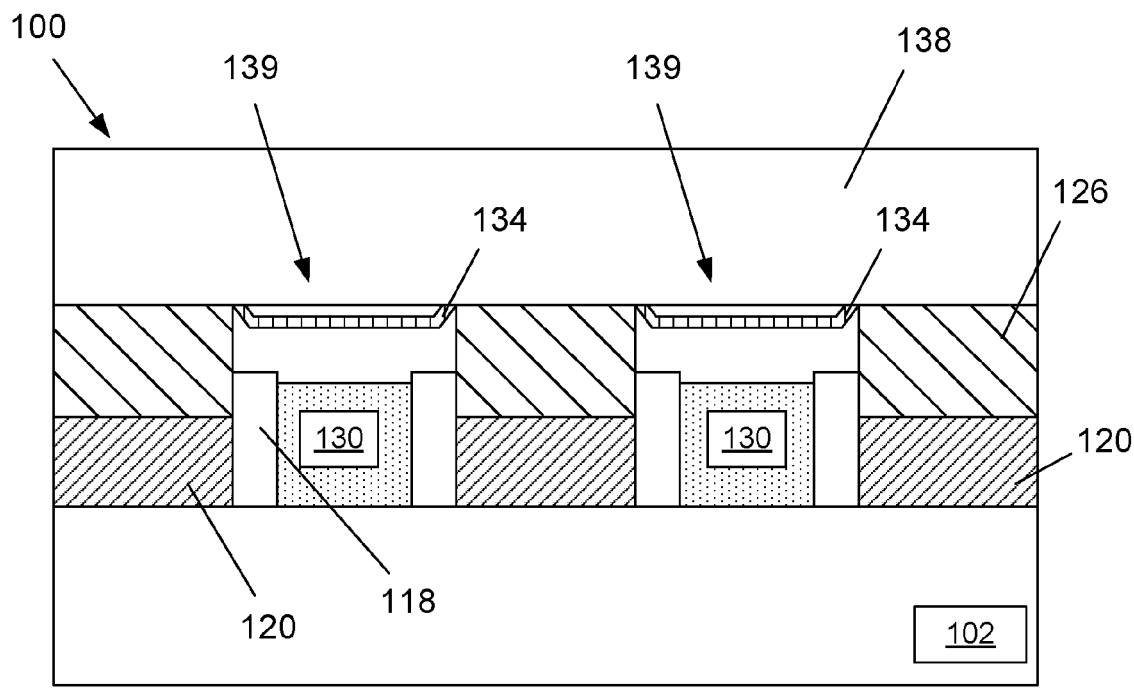

FIG. 3G depicts the product 100 after the above-described layer of insulating material 138 was deposited across the product 100 above the multi-layer gate cap structures 139.

Figure 3H:
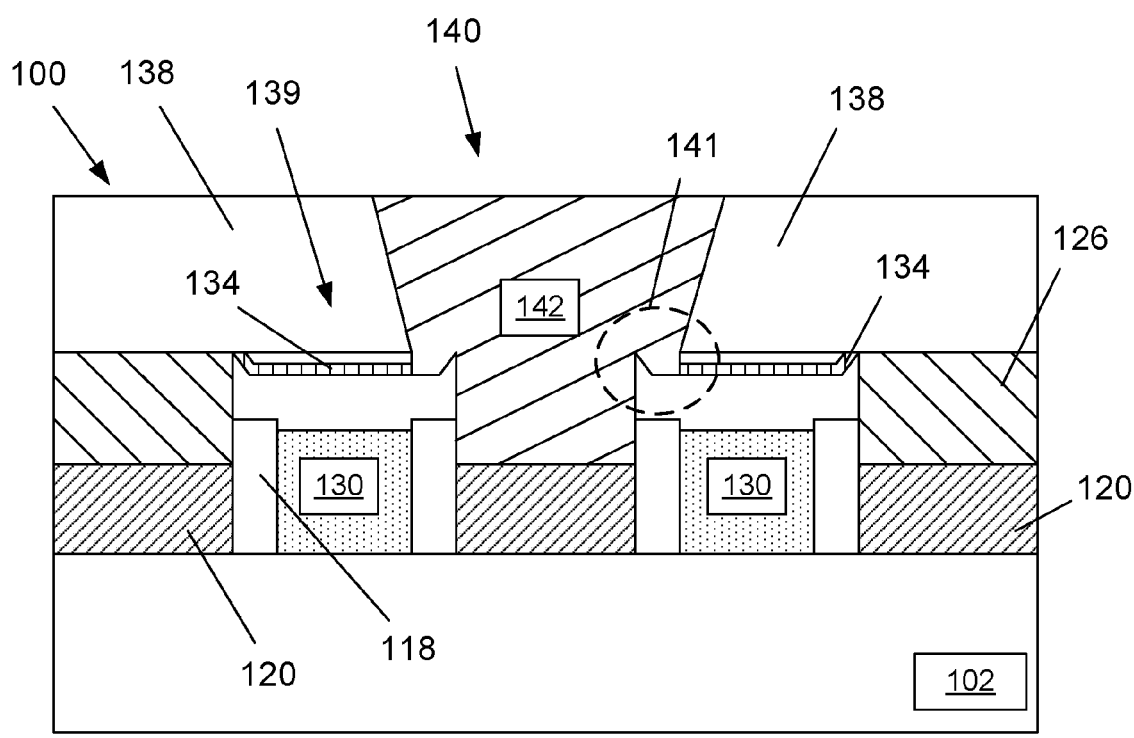

FIG. 3H depicts the product 100 after the above-described self-aligned contact opening 140 and self-aligned contact structure 142 were formed. Also note that, as depicted in the dashed-line region 141, even if some of the multi-layer gate cap structure 139 is removed, i.e., a portion of the second gate cap material layer 136, during the contact etch process, the underlying second high-k protection layer 134 still provides protection to the underlying gate structure 130 during the contact formation process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor device, comprising:
   a gate structure;
   first and second spacers positioned adjacent opposite sides of said gate structure, said first and second spacers having upper surfaces; and
   a multi-layer gate cap structure positioned above said gate structure and said upper surfaces of said first and second spacers, wherein said multi-layer gate cap structure comprises:
      a first gate cap material layer positioned on an upper surface of said gate structure and on said upper surfaces of said first and second spacers;
      a first high-k protection layer positioned on an upper surface of said first gate cap material layer; and
      a second gate cap material layer positioned on an upper surface of said first high-k protection layer, wherein said first and second spacers, said first and second gate cap layers, and said high-k protection layer comprise dielectric materials, and said first and second gate cap layers comprise different materials than said first high-k protection layer.

2. The device of claim 1, wherein said upper surface of said first gate cap material layer is non-planar.

3. The device of claim 2, wherein said upper surface of said first high-k protection layer is non-planar.

4. The device of claim 3, wherein an upper surface of said second gate cap material layer is substantially planar.

5. The device of claim 1, wherein said first gate cap material layer is made of silicon nitride, said first high-k protection layer is made of hafnium oxide and said second gate cap material layer is made of silicon nitride.

6. The device of claim 1, further comprising a second high-k protection layer contacting a portion of a sidewall of said first spacer and a sidewall portion of said first gate cap material layer.

7. The device of claim 6, further comprising first and second source/drain regions positioned adjacent said first and second spacers, respectively, wherein said second high-k protection layer contacts an upper surface of said first source/drain region.

8. The device of claim 7, wherein said first and second high-k protection layers are comprised of the same high-k material.

9. The device of claim 1, further comprising:
a layer of insulating material disposed above said multi-layer gate cap structure; and
a contact structure positioned in said layer of insulating material and contacting said gate structure, said first gate cap material layer, and a sidewall portion of said second spacer.

10. A transistor device, comprising:
a gate structure;
first and second spacers positioned adjacent opposite sides of said gate structure, said first and second spacers having upper surfaces;
first and second source/drain regions positioned adjacent said first and second spacers, respectively;
a first high-k protection layer contacting a portion of a sidewall of said first spacer and an upper surface of said first source/drain region; and
a multi-layer gate cap structure positioned above said gate structure and said upper surfaces of said first and second spacers, wherein said multi-layer gate cap structure comprises:
a first gate cap material layer positioned on an upper surface of said gate structure and on said upper surfaces of said first and second spacers;
a second high-k protection layer positioned on an upper surface of said first gate cap material layer; and
a second gate cap material layer positioned on an upper surface of said second high-k protection layer, wherein said first and second spacers, said first and second gate cap layers, and said high-k protection layer comprise dielectric materials, and said first and second gate cap layers comprise different materials than said second high-k protection layer.

11. The device of claim 10, wherein said first high-k protection layer contacts a sidewall portion of said first gate cap material layer.

12. The device of claim 10, wherein said upper surface of said first gate cap material layer is non-planar.

13. The device of claim 12, wherein said upper surface of said second high-k protection layer is non-planar.

14. The device of claim 13, wherein an upper surface of said second gate cap material layer is substantially planar.

15. The device of claim 10, wherein said first gate cap material layer is made of silicon nitride, said first and second high-k protection layers are made of hafnium oxide and said second gate cap material layer is made of silicon nitride.

16. The device of claim 10, wherein said first and second high-k protection layers are comprised of the same high-k material.

17. The device of claim 10, further comprising:
a layer of insulating material disposed above said multi-layer gate cap structure; and
a contact structure positioned in said layer of insulating material and contacting said gate structure, said first gate cap material layer and a sidewall portion of said second spacer.

* * * * *